United States Patent [19]

Takayama et al.

[11] Patent Number: 5,008,668

[45] Date of Patent: Apr. 16, 1991

[54] METHOD AND APPARATUS FOR ENCODING AND DECODING DATA IN RESIDUE NUMBER SYSTEM

[75] Inventors: Jun Takayama, Tokyo; Takeshi Ninomiya, Kanagawa; Tadao Fujita, Kanagawa; Yoshiaki Inaba, Kanagawa, all of Japan

[73] Assignee: Sony Corporation, Tokyo, Japan

[21] Appl. No.: 256,732

[22] Filed: Oct. 12, 1988

[30] Foreign Application Priority Data

Oct. 12, 1987 [JP] Japan .............................. 62-257025
Oct. 15, 1987 [JP] Japan .............................. 62-260991

[51] Int. Cl.$^5$ ............................................. H03M 7/18
[52] U.S. Cl. ......................................... 341/83; 341/106
[58] Field of Search ....................... 341/61, 83, 95, 106

[56] References Cited

U.S. PATENT DOCUMENTS

| | | | |
|---|---|---|---|
| 4,584,561 | 4/1986 | Bernardson | 341/83 |
| 4,584,562 | 4/1986 | Bernardson | 341/50 |
| 4,584,563 | 4/1986 | Bernardson | 341/83 |
| 4,584,564 | 4/1986 | Bernardson | 341/83 |
| 4,588,980 | 5/1986 | Bernardson | 341/83 |
| 4,598,266 | 7/1986 | Bernardson | 341/106 |
| 4,752,904 | 6/1988 | Paul | 341/83 |
| 4,816,805 | 3/1989 | Vojir et al. | 341/83 |

*Primary Examiner*—William M. Shoop, Jr.
*Assistant Examiner*—Marc S. Hoff
*Attorney, Agent, or Firm*—Alvin Sinderbrand

[57] ABSTRACT

In a method and apparatus for encoding and decoding data in the residue number system, input binary data are supplied to an encoder to be divided by moduli $m_0$, $m_1$, $m_2$, ... m (i.e., positive integers having a mutually prime relation). Residue data corresponding to respective moduli are output from the encoder to a digital filter circuit including a plurality of digital filters, each filter corresponding to a respective modulus. Processing for some specified application is performed by the digital filters based, for example, on the Mixed Radix Conversion Method method to generate output data still in the residue format. The residue data output from the digital filters then are input to a decoder to be converted back into binary data. Encoding is performed by splitting n-bit straight binary data into, for example, upper bit data and lower bit data, received by respective ROM tables. Each ROM table outputs a value to another common ROM table which outputs the converted residue data. The ROM tables convert the binary data by weighing each input bit by a value corresponding to the particular bit. The capacity needed for the ROM tables is reduced, enabling the encoder circuit configuration to be simple and fast. Decoding is performed by scaling down RNS data to obtain a plurality of residue data corresponding to respective moduli, adding one to a fixed bit of the residue data for discriminating positive and negative numbers, and performing addition on such residue data with fixed moduli to obtain binary data.

5 Claims, 7 Drawing Sheets

METHOD AND APPARATUS FOR ENCODING AND DECODING DATA IN RESIDUE NUMBER SYSTEM

BACKGROUND OF THE INVENTION

The present invention relates to an encoder and a decoder for residue number system data conversion in a digital signal processing circuit.

Digital signal processing circuits such as a digital filter and the like for performing a residue number system operations have been proposed. Refer to "IRE Transactions On Electronic Computers," Vol. EL-8, No. 6, June 1959, pp. 140–147. "IEEE computer," Vol. 17, No. 5, May 1984, pp. 50–61" and "The Transactions of the Institute of Electronics and Communication Engineers, '84/4 Vol. J67-1, No. 4 pp. 536–543."

Since a carry operation is unnecessary in a residue number system, operations on digital signals can be performed in the residue number system with high accuracy and high speed.

After input binary data is converted into a set of residue data (hereinafter it is called as RNS data), and after a desired operation is carried out in a residue number system, the obtained RNS data are converted back into output binary data.

If a conversion table is constituted using ROM (Read Only Memory) for the encoder and the decoder, the RNS data and the binary data can be obtained with high speed.

However, to convert n-bit binary data using a ROM table into RNS data represented, for example, by a plurality of $K_i$-bit residue data, a ROM table capacity A represented by the following expression is needed with respect to each of modula $M_i$ (where $i=0, 1, 2, \ldots$)

$$A = 2^n \cdot K_i \text{ (bit)}$$

For example, when the binary data and the residue data are represented by 14 bits and 4 bits, respectively, the ROM table capacity represented by the following expression is needed.

$$A = 2^{14} \times 4 = 65536 \text{ (bit)}$$

A problem with using a ROM table of such a large capacity is that the access time of the ROM table becomes too large to convert binary data into RNS data within acceptable time constraints.

As for a method by which RNS data are demodulated back into binary data, a Mixed Radix Conversion Method (hereinafter called as MRC method) is known as shown in the paper entitled "Residue Arithmetic and its Application To Computer Technology (1967)".

In this method, residue data composing RNS data are applied with scale-down processing in order step by step using a multiplicative inverse element of a value of one modulus for that of another modulus to reduce the number of the residue data. After the residue data remaining finally have been applied with multiplication processing using a fixed modulus, the RNS data then are converted to binary data by obtaining additional data.

In this case, however, since the residue data are applied with scale-down processing in order step by step, there is a problem that the whole configuration becomes large-scaled.

Another problem with using a residue number system is that although a negative number can be represented by 2's complement binary against natural or straight binary in binary data, a negative number is not particularly defined in RNS data. Therefore operations for processing negative numbers become complicated.

OBJECTS AND SUMMARY OF THE INVENTION

Accordingly, an object of the present invention is to provide a new encoder and a new decoder for RNS data each of which solves the conventional defects described above.

In particular, an object of the present invention is to provide an encoder and a decoder for RNS data, each of which has a compact configuration and a rapid conversion speed.

Another object of the present invention is to provide an encoder and a decoder for RNS data which allow processing operations to be simplified by defining positive numbers and negative numbers in RNS data.

DETAILED DESCRIPTION OF THE PREFERRED EMBODIMENT

The relationship between binary data and RNS data based on, for example, a Chinese remainder theorem is explained below.

According to the Chinese remainder theorem, a value X in a modulus $m_i$ may have a remainder $R_i$. This relationship is represented by the following expression (1), $$R_i 3 = 2 \, X \, MOD \, m_i \tag{1}$$

Similarly, RNS data $D_{R0}$ may be represented by the respective remainder values $R_0, R_1, R_2, -R_i$, for respective moduli $m_o, m_1, m_2, -m_i$. Binary data having the value B and corresponding to RNS data $D_{R0}$ can be represented by the following expression (5) using the values M, $M_i$, and $N_i$, represented by the following relations (2), (3), and (4), respectively.

$$M = \pi m_i \tag{2}$$

$$M_i = M/m_i \tag{3}$$

$$I = N_i \cdot M_i MOD \, m_i \tag{4}$$

$$B = (\Sigma R_i \cdot M_i \cdot N_i) MOD \, M \tag{5}$$

In this case, the binary data and the RNS data have one-to-one correspondence in the range which is not over the dynamic range M of the RNS data.

If, in processing the residue data, the same procedure as for processing binary data represented by 2's complement is used, the configuration of the circuit for processing the residue data can be made simpler.

Figure 1:
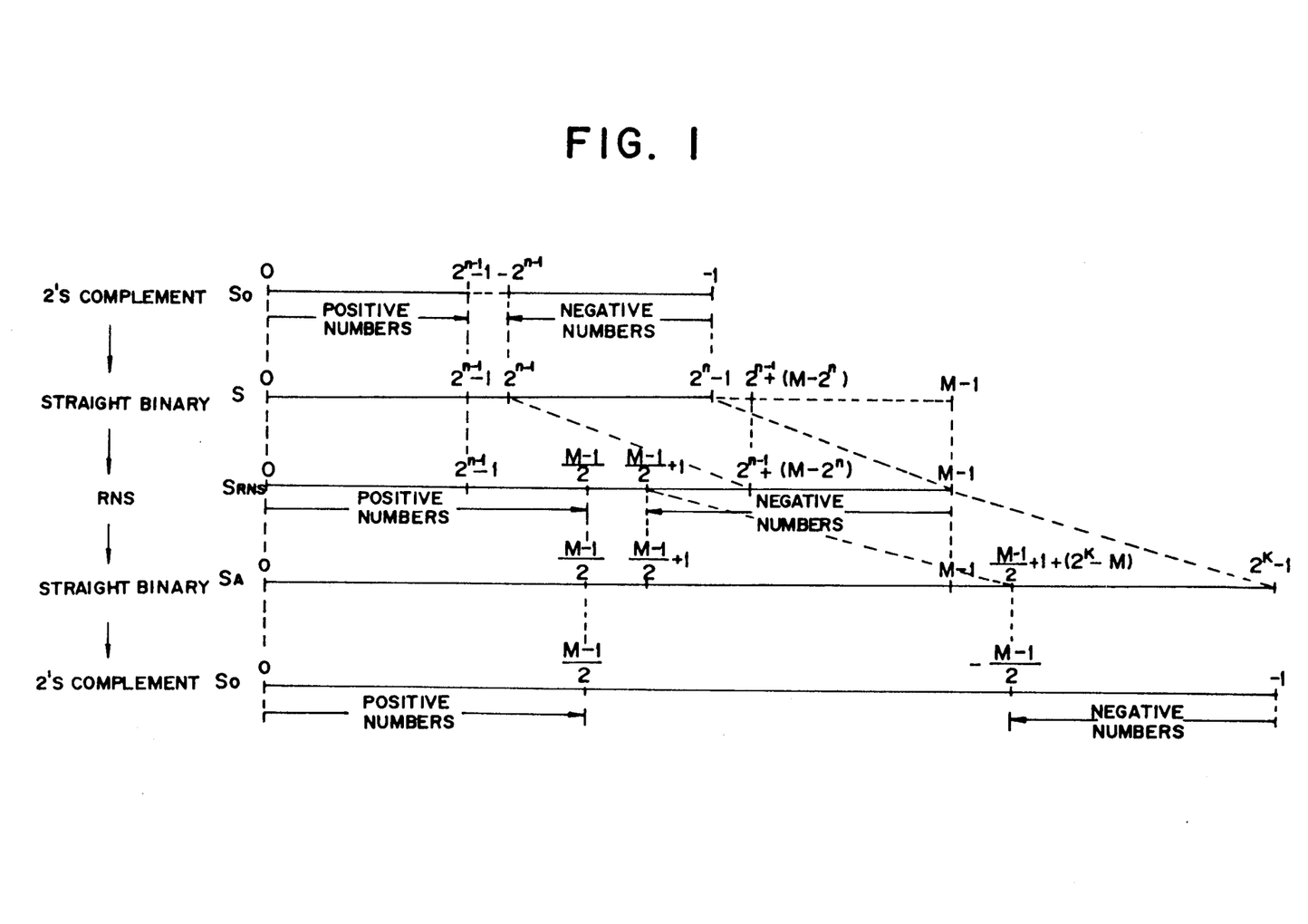
FIG. 1 is a diagram showing the relation between binary data and RNS data in accordance with an encoder and a decoder of the present invention.

As shown in FIG. 1, in general, n-bit binary data of 2's complement can represent decimal digits of $-2^{n-1}$ to $2^{n-1}-1$ and n-bit straight binary data can represent decimal digits of 0 to $2^n-1$. On the other hand, RNS data can represent decimal digits of 0 to M−1 using a dynamic range M (shown by the expression (2) above.) In addition, the RNS data may be assigned to regions of positive numbers and negative numbers correspondingly to the assigning of regions for 2's complement binary data.

In the case where M is odd, the region where a value $S_{RNS}$ represents positive numbers is 0 to $(M-1)/2$ and the region where the value $S_{RNS}$ represents negative numbers is $(M-1)/2+1$ to $M-1$.

The decimal digit $2^n-1$ as represented by straight binary data is a decimal digit of −1 when represented in the binary data 2's complement format. When this digit is represented by RNS data, it becomes RNS data corresponding to complement representation of M−1 for a decimal digit M.

Since the expression $$2^n - 1 + M(M - 2^n) = M - 1 \quad (11)$$

holds, when the value S of the straight binary data is in the range of $0 \leq S \leq 2^{n-1}-1$, the residue data having the value $R_i$ represented by the following expression (12) constitute RNS data.

$$R_i = S \text{ MOD } m_i \quad 12)$$

When the value S is in the range of $2^n \leq S \leq 2^n - 1$, the residue data having the value $R_i$ represented by the expression (13) constitute RNS data.

$$R_i = (S + M - 2^n) \text{ MOD } m_i \quad (13)$$

In other words, a positive or negative number is distinguished by the most significant bit of binary data. When the value of the most significant bit is zero (that is, when it is a positive number), residue data of each modulus $m_i$ are calculated from the binary data concerned. When the value of the most significant bit is 1 (that is, it is a negative number), first natural binary data are added with the fixed value (that is, the value $M-2^n$) in such a manner that the maximum value $2^{n-1}$ of the natural binary data (that is, the value represented by binary data of 2's complement−1) becomes the maximum value M−1 of the RNS data (that is, the value represented by the RNS data−1), then the residue data of each modulus are calculated.

When RNS data are converted back into binary data of 2's compliment, k-bit binary data (capable of representing a larger value than the dynamic range M) are made to correspond to the RNS data. When the value $S_A$ of natural binary data is decoded by the MRC method, the range of $0 \sim (m-1)/2$ for the value $S_A$ is interpreted as a positive number, and k-bit binary data of 2's complement are obtained. When the value $S_A$ is in the range of $(m-1)/2+1 \sim (M-1)$, the value $S_A$ is interpreted as a negative number, and binary data of 2's complement are obtained by adding the value $2^k - M$ to the value $S_A$ decoded in such a manner that the maximum value M−1 obtained by decoding the RNS data of dynamic range M becomes the maximum value $2^k - 1$ of the value $S_A$ of the k-bit binary data of 2's complement −1.

Embodiments of an encoder and a decoder for RNS data according to the present invention are described below in detail with reference to the drawings.

Figure 2:
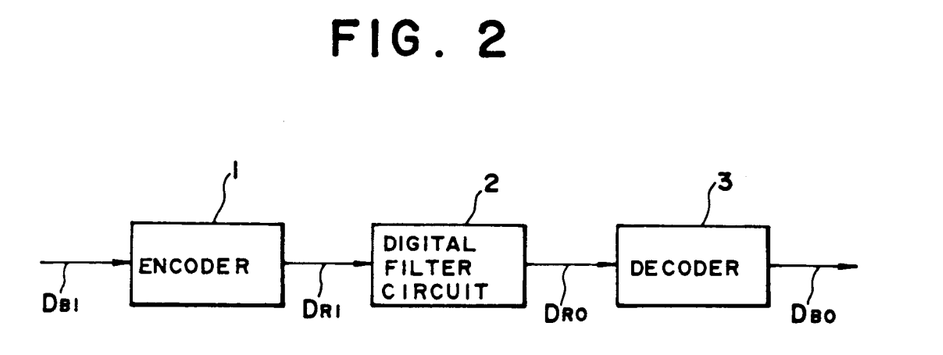
FIG. 2 is a block diagram showing digital processing devices such as a digital filter and the like to which an encoder and a decoder of the present invention are applied.

Referring to FIG. 2, a signal processing circuit using residue operation is shown. In FIG. 2, input binary data $D_{BI}$ are supplied to an encoder 1 to be divided by positive integers $m_0, m_1, m_2, —m_i$ having a mutually prime relation. Residue data corresponding respectively to the integers $m_0, m_1, m_2, m_3, —m_i$ then are output from the encoder 1 to a digital filter circuit 2 as RNS data $D_{RI}$.

In the digital filter circuit 2, a plurality of digital filters each corresponding to a modulus respectively receive the RNS data $D_{RI}$ which corresponds to such modulus and process the RNS data. As a result, the desired processing for the binary data can be executed with remarkably high speed relative to the speed for processing the binary data itself.

Although the digital filter circuit 2 is composed of a plurality of digital filters, one digital filter may be employed alternatively in a time sharing manner.

The residue data output from the digital filters of digital filter circuit 2 are supplied to a decoder 3 as RNS data $D_{R0}$ where the data are converted into output binary data $D_{B0}$.

Figure 3:
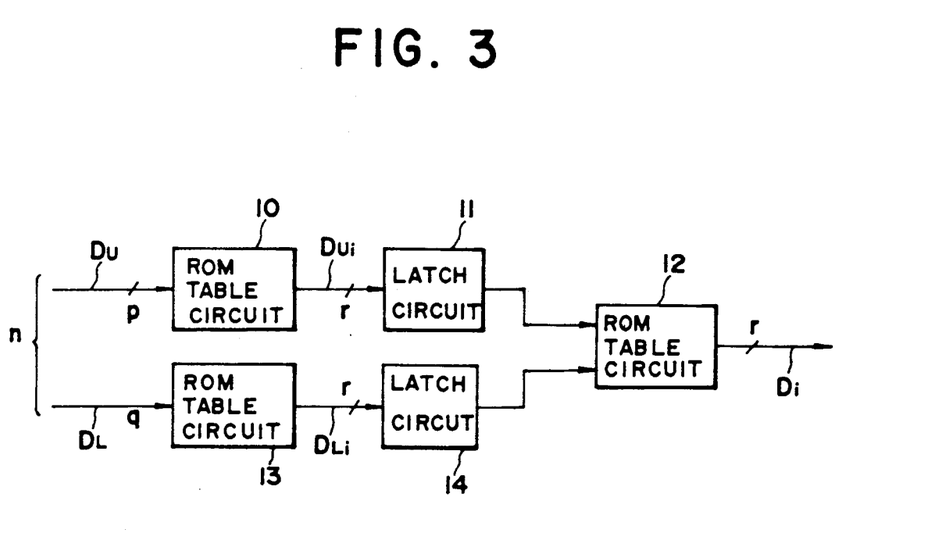
FIG. 3 is a conceptual block diagram of the encoder of the present invention for illustrating the conversion of binary data into RNS data.

FIG. 3 shows the principle of converting binary data into RNS data in an encoder according to the present invention to obtain residue data $D_i$ of the modulus $m_i$.

In accordance with such conversion, n-bit straight binary data having the value S are divided into the p-bit data $D_u$ having the value $S_u$ (hereinafter it is called as the upper bit data) and the q-bit data $D_L$ having the value $S_L$ (hereinafter it is called as the lower bit data).

The value S of the binary data can be represented by the following relation (6).

$$S = S_u \times 2^q + S_L \quad (6)$$

The residue data value $R_i$ of modulus $m_i$ corresponding to the value S can be represented by the following relation (7).

$$R_i = (S_u \times 2^q + S_L) \text{ MOD } m_i = \{(S_u \times 2^q) \text{ MOD } m_i + S_L \text{ MOD } m_i\} \text{MOD } m_i \quad (7)$$

A ROM table 10 receives the upper bit data $D_u$ and outputs residue data $D_{ui}$ having the value $R_{ui}$ represented by the relation (8) to a ROM table 12 via a latch 11.

$$R_{ui} = (S_u \times 2^p) \text{ MOD } M_i \quad (8)$$

A ROM table 13 receives lower bit data $D_L$ and outputs residue data $D_{Li}$ having the value $R_{Li}$ represented by the relation (9) to a ROM table 12 via a latch 14.

$$R_{Li} = S_L \text{ MOD } m_i \quad (9)$$

The ROM table 12 outputs the residue data $D_i$ having the value $R_i$ represented by the following expression (10).

$$R_i = (R_{ui} + R_{Li}) \text{ MOD } m_i \quad (10)$$

Accordingly, as shown by the expressions (8), (9), and (10), the residue data $D_i$ of the modulus $m_i$ can be obtained from the added values of the residue data $D_{ui}$ of modulus $m_i$ after weighing the data $D_{ui}$ by the value corresponding to the particular upper bit data $D_u$ (that is, the value $2^q$) and weighing the residue data $D_{Li}$ of modulus $m_i$ corresponding to the lower bit data $D_L$.

If the value of the modulus $m_i$ is selected in such a manner that the bit length $K_i$ of the residue data $D_i$ becomes equal to $\gamma$ the ROM tables 10 and 13 would need capacities of the values represented by expressions $A_1 = 2^P \times \gamma$ and $A_2 = 2^q \times \gamma$. The ROM table 12 would need the capacity of the value represented by the expression $A_3 - 2^{2r} \times \gamma$. Accordingly, a ROM table having capacity of $A_1 + A_2 + A_3 = (2^P + 2^q + 2^{2r}) \times \gamma$ in total is needed in order to obtain the residue data $D_i$ of the modulus $m_i$.

For example, until now a ROM having the capacity of 65536 bits has been needed to obtain four-bit residue data composing RNS data from 14 bit binary data. According to the described embodiment of this invention, the capacity needed can be reduced to 3070 bits, and the encoder circuit configuration can be simpler on the whole, allowing RNS data to be obtained with high speed.

Figure 4:
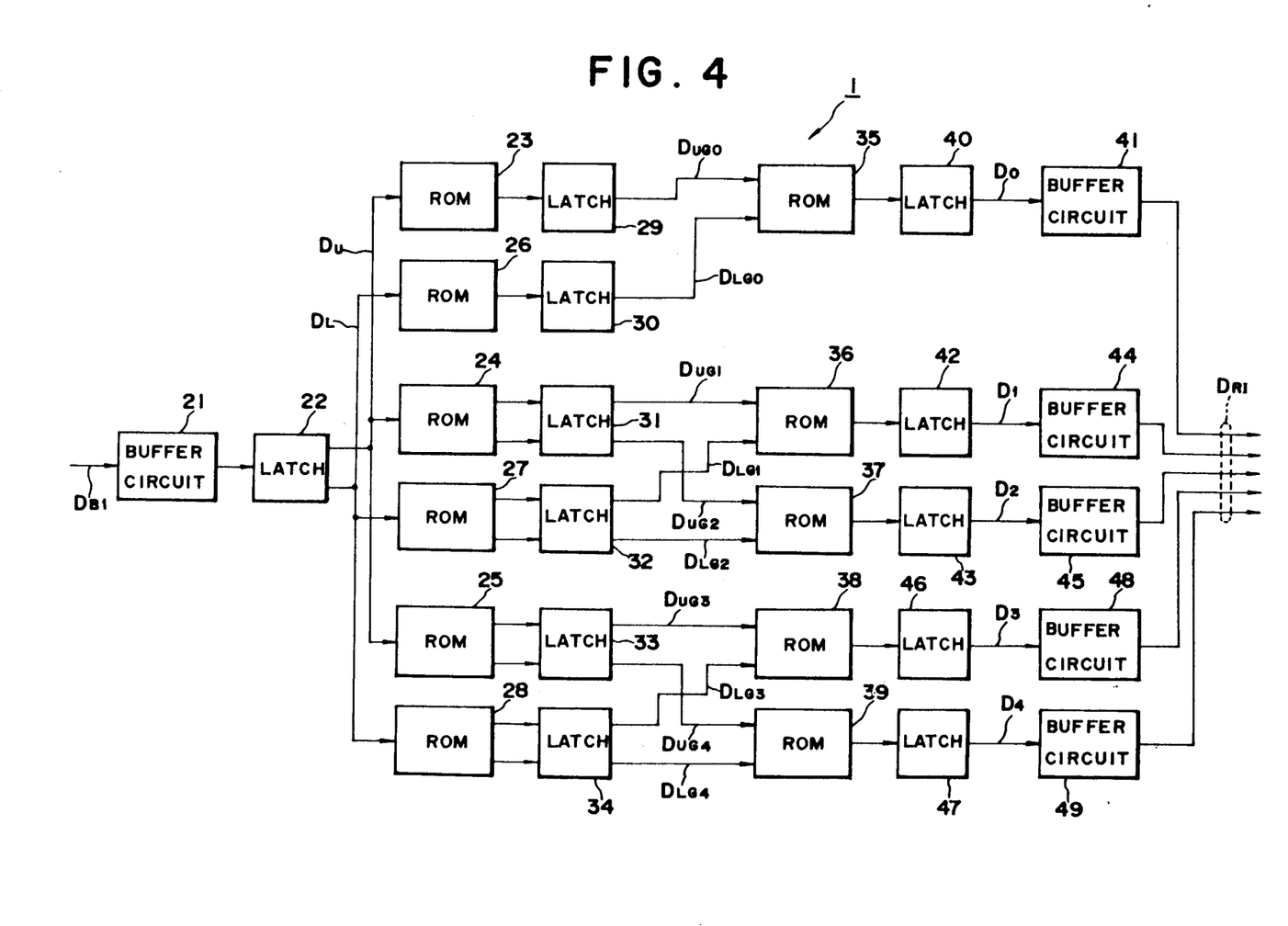
FIG. 4 is a block diagram showing an embodiment of the encoder according to the present invention.

Next, a specific example of an encoder 1 will be described. In FIG. 4, an encoder circuit 1 outputs RNS data $D_{RI}$ composed of the residue data $D_0 - D_4$ for five respective moduli $m_0 - m_4$ of values, for example, 7, 11, 13, 15 and 16 from the input digital image signal $D_{BI}$ composed of binary data.

In the encoder circuit 1, 14-bit binary data represented by 2's complement are received in a latch 22 via a buffer circuit 21 and separated into upper bit data $D_u$ and lower bit data $D_L$ both comprising 7 bits. The separated data composing $D_u$ and $D_L$ are supplied to ROMs 23, 24 and 25, and ROMs 26, 27 and 28, respectively.

The buffer circuit 21 and the latch 22 divide input data $D_{BI}$ for each desired bit number, so as to form a data dividing means which outputs a plurality of data made of upper bit data and lower bit data.

The ROMs 26, 27 and 28 output residue data of lower bit data $D_L$ for the respective moduli $m_0$, $m_1$, $m_2$, $m_3$ and $m_4$ (in this case moduli 7, 11, 13, 15 and 16). The ROMs 23, 24 and 25 output residue data of upper bit data $D_u$ for the respective modulus $m_0$, $m_1$, $m_2$, $m_3$ and $m_4$.

Thus, the residue data separated into the upper bit data $D_u$ and the lower bit data $D_L$ are output, while allowing the capacity of the ROM tables needed for conversion of the RNS data to be reduced on the whole, and allowing an encoder having a fast conversion speed with a simple configuration on the whole to be obtained.

In the ROMs 24, 25, 27, and 28, each ROM is provided with two conversion tables. For example, ROMs 24 and 27 may output residue data of modulus $m_1$ and $m_2$, and ROMs 25 and 28 may output residue data of modulus $m_3$ and $m_4$. This is for effective utilization of the capacity of the ROM. Alternatively, respective conversion tables may be provided in independent ROMs.

In the case where the residue data are separated into the upper bit data $D_u$ and the lower bit data $D_L$ and converted by the ROM, the value in the parenthesis of the expression (13), $(S+M-2^n)$, can be rewritten into the following relation, that is $$S + M - 2^n = (S_u \times 2^q + S_L) + M - 2^n \quad (14)$$
$$= (S_u \times 2^q + M - 2^n) + S_L$$
$$= (S_u \times 2^q) + (M - 2^n + S_L)$$

For example, for the lower bit data $D_L$, the residue data $D_{LGi}$ having the value $R_{Li}$ represented by the expression (9) are output. For the upper bit data $D_u$, the region of positive numbers and of negative numbers are defined by the value $S_u$ of the data $D_u$. When the value $S_u$ is in the range of $0 \leq S_u \leq 2^{P-1} - 1$, the residue data $D_{uGi}$ having the value $R_{ui}$ represented by the relation (15) are output. When the value $S_u$ is in the range of $2^{P-1} \leq S_u \leq 2^{P} - 1$ the remainder data $D_{LGi}$ having the value $R_{ui}$ represented by the relation (16) are output.

$$R_{ui} = (S_u \times 2^q) \text{ MOD } m_i \quad (15)$$

$$R_{ui} = (S_u \times 2^q + M - 2^n) \text{ MOD } m_i \quad (16)$$

Thus, residue data are obtained having values formed by adding the value of data $D_{uGi}$ to that of data $D_{LGi}$. When positive and negative numbers are represented correspondingly to positive and negative numbers of binary data, RNS data can be obtained.

In the case where RNS data are converted as described previously, after the 14-bit binary data are subject to rounding to 13-bit binary data, the ROMs 26, 27 and 28, which receive the lower bit data $D_L$, output residue data having the value $R_{LGi}$ as represented by the following expression (17) (in place of the residue data having the value represented by the expression (9)).

$$R_{LGi} = (S_L + 1)/2 \text{ MOD } m_i \quad (17)$$

This means that the 7 lower bits of data are subjected to rounding to 6-bit data by adding the value 1 to the lowest bit of lower bit data $D_L$ and then omitting the lowest bit concerned. Residue data $D_{LGi}$ then are output with respect to the rounded 6-bit data concerned.

The ROMs 23, 24 and 25 which receive the upper bit data $D_u$ provide weighing of the value $2^6$ corresponding to processing of rounding the lower bit data $D_L$ to 6 bits. The ROMs 23, 24 and 25 output the residue data $D_{uGi}$ having the value $R_{uGi}$ as represented by the relation (18) for $0 \leq S_u \leq 63 = 2^{7-1} - 1$.

$$R_{uGi} = (S_u \times 2^6) \text{ MOD } m_i \quad (18)$$

On the other hand, for $64 \leq S_u \leq 127 \leq 2^7 - 1$, the residue data $D_{uGi}$ having the value $R_{uGi}$ represented by the relation (19) are output.

$$R_{uGi} = (S_u \times 2^6 + M - 2^{13}) \text{ MOD } m_i \quad (19)$$

Here, the value M is represented by the following expression (20) from the expression (2).

$$\begin{aligned}M &= \pi\; m_i \\ &\phantom{=}\; j=0 \\ &= 7 \times 11 \times 13 \times 15 \times 16 \\ &= 240240\end{aligned} \quad (20)$$

Accordingly, since the residue data have been subjected to rounding to 13 bits, they can represent the positive numbers from the value 0 to the value 8191 when the value S of the whole of the binary data is in the range from the value 0 to the value 8191, and the negative numbers from the value −8191 to the value −1 when the value S is in the range from the value 8192 to the value 16383.

Accordingly, like in this embodiment, even in the case where a digital video signal $S_{BI}$ having a bit length of either 13 bits or 14 bits is input by receiving a 14-bit digital video signal $S_{BI}$ and rounded to 13 bits in advance, the video signal $S_{BI}$ can be converted in practice into RNS data with sufficient accuracy.

Thus, the ROMs 23, 24, 25, 26, 27 and 28 give weight of value $2^6$ to the upper bit data $D_u$ and weight of value $2^0$ to the lower bit data $D_L$ forming a first ROM table circuit for converting the upper and lower bit data $D_u$ and $D_L$ into residue data $D_{uG0}$, $D_{uG1}$, $D_{uG2}$, $D_{uG3}$, $D_{uG4}$, $D_{LG0}$, $D_{LG1}$, $D_{LG2}$ $D_{LG3}$, and $D_{LG4}$ every five norms $m_0 \sim m_4$.

A ROM 35 receives, via latches 29 and 30, the residue data $D_{uG0}$ and $D_{1LG0}$ of modulus $m_o$, (i.e. 7) output from the ROM 23 and the ROM 26 respectively and outputs, via a latch 40 and a buffer circuit 41, the residue data $D_0$ having the value represented by the expression (10).

ROMs 36 and 37 receive, via latches 31 and 32, the residue data $D_{uG1}$ and $D_{LG1}$, and $D_{uG2}$ and $D_{LG2}$ of moduli $m_1$, and $m_2$ (i.e. 11 and 13) output from the ROMs 24 and 27, respectively, and output, via latches 42 and 43 and buffer circuits 44 and 45, the residue data $D_1$ and $D_2$ having the values represented by the expression (10) in the same way as the ROM 35.

ROMs 38 and 39 receive, via latches 33 and 34, the residue data $D_{uG3}$ and $D_{LG3}$, and $D_{uG4}$ and $D_{LG4}$ of moduli, $m_3$ and $m_4$ (i.e. 15 and 16) outputs from the ROMs 25 and 28, respectively, and outputs, via latches 46 and 47 and buffer circuits 48 and 49, the residue data $D_3$ and $D_4$ having the values represented by the expression (10).

Thus, the residue data $D_0$ and $D_4$ of moduli 7, 11, 13, 15, and 16 are obtained via the buffer circuits 41, 44, 45, 48, and 49, and RNS data $D_{RI}$ comprising the residue data $D_0$ to $D_4$ can be obtained. Thus, the ROMs 35, 36, 37, 38, and 39 form a second ROM table circuit which converts the added values of the residue data of moduli $m_0$, $m_1$, $m_2$, $m_3$ and $m_4$ into the corresponding residue data $D_0$, $D_1$, $D_2$, $D_3$, and $D_4$ of norms $m_0$, $m_1$, $m_2$, $m_3$, and $m_4$.

With the above configuration, in which the residue data is obtained based on the fixed norms using the ROM table circuits, the residue data are separated into the upper bit data and lower bit data and then processed, thereby allowing capacities of the ROM table circuits to be reduced.

Accordingly, the configuration of the encoder circuit can be made simpler, allowing the conversion speed to be made high.

In the above-mentioned embodiment, the case where the lower bit data have been subjected to rounding has been described. The present invention, however, is not so restricted. Rounding need be carried out only as required.

Further, in the above-mentioned embodiment, the case where 14-bit binary data is separated into 7 bits of upper bit data and 7 bits of lower bit data and then processed has been described. The bit length to be separated, however, is not restricted to 7 bits. For example, the binary data may be separated into data of 6 bits and 8 bits, and the bit values can be selected to a desired value as required.

Further, in the above-mentioned embodiment, the case where the binary data are separated into two kinds of data, that is, upper bit data and lower bit data has been described. The present invention, however, is not so restricted. For example, the binary data may be separated into three kinds of data or into plural kinds of data for processing as required.

Next, the decoder 3 (see FIG. 2) will be described. The decoder 3 receives RNS data $D_{R0}$ output from the digital filter circuit 2 and outputs binary data $D_{B0}$, based on, for example, the MRC method as described previously.

The MRC method will be described in more detail. At first, with respect to the residue $R_i$ of S pertaining to the modulus $m_i$ shown in the expression (1), and assuming that S is generally represented by X, the value $X_i$ represented by the following expression (21) is defined to be a multiplicative inverse element of X pertaining to the modulus m.

$$1 - (X_i \cdot X) \bmod m_i \qquad (21)$$

provided that $0 \leq X \leq m_i$

Then, the value $R_{ij}$ is obtained, which satisfies the expression (22) using the values $R_i$ and $R_j$ of the residue data pertaining to the moduli $m_i$ and $m_j$ and the multiplicative inverse element $X_{ij}$ of the value $m_j$ pertaining to the modulus $m_i$;

$$R_{ji} = \{(R_i - R_j) X_{ij}\} \bmod m_i \qquad (22)$$

This processing is scale-down processing pertaining to the modulus $m_j$.

The scale-down processing is performed in parallel for $D_0$ to $D_3$ and repeated in sequence for predetermined residue data to gradually reduce the number of residue data which require scale-down processing and to obtain a plurality of residue data corresponding to the modulus of the RNS data. After the residue data are multiplicatively processed using a predetermined modulus, added data are obtained, thereby converting the RNS data into binary data.

Figure 5:
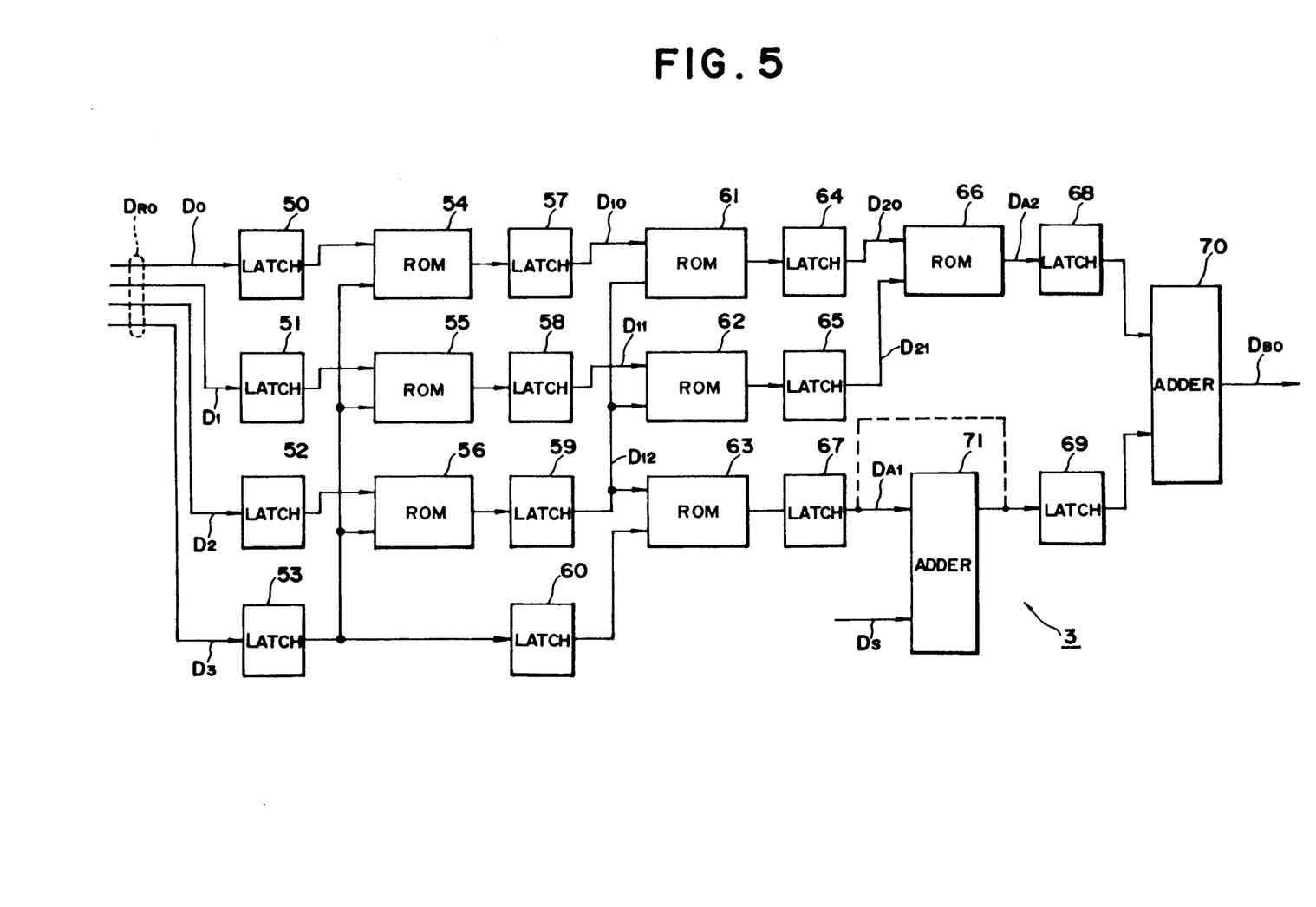
FIG. 5 is a conceptual block diagram of the decoder of the present invention for illustrating the conversion of RNS data back into binary data.

The fundamental principle of the decoder will be explained using FIG. 5. Residue data $D_0$, $D_1$ and $D_2$ pertaining to the moduli $m_0$, $m_1$ and $m_2$, via latch circuits 50, 51 and 52 are supplied to ROM table circuits 54, 55 and 56.

Furthermore, the ROM table circuits 54, 55 and 56 each receive via latch circuit 53 the residue data $D_3$ pertaining to the modulus $m_3$.

The ROM table circuit 54 outputs residue data $D_{10}$ having the value $R_{10}$ based on the expression (22) using a multiplicative inverse element X03 of the value $m_3$ (that is, the modulus of the residue data $D_3$) pertaining to the modulus $m_0$ with the values of the residue data $D_0$ and $D_3$ set at $R_0$ and $R_3$. The ROM table circuit 55 outputs residue data $D_{11}$ having the value $R_{11}$ based on the expression (22) using a multiplicative inverse element X13 of the value $m_3$ pertaining to the modulus $m_i$ with the value of the residue data $D_1$ set at $R_1$. The ROM table circuit 56 outputs residue data $D_{12}$ having the value $R_{12}$ based on the expression (22) using a multiplicative inverse element X23 of the value $m_3$ pertaining to the modulus $m_2$ with the value of the residue data D set at R.

The outputs of the ROM table circuits 54, 55 and 56 and the latch circuit 53 are again provided to ROM table circuits 61, 62 and 63 via latch circuits 57, 58, 59 and 60. The ROM table circuit 61 receives the residue data $D_{10}$ and $D_{12}$ and outputs residue data $D_{20}$ having the value $R_{20}$ based on the expression (22) using a multiplicative inverse element $X_{02}$ of the value $m_2$ pertaining to the modulus $m_0$.

The ROM table circuit 62 receives the residue data $D_{11}$ and $D_{12}$ and outputs residue data $D_{21}$ having the value $R_{21}$ based on the expression (22) using a multiplicative inverse element $X_{12}$ of the value $m_2$ pertaining to the modulus $m_1$.

On the other hand, the ROM table circuit 63 receives the residue data $D_3$ and $D_{12}$ and outputs addition data $D_{A1}$ of the value $S_{A1}$ represented by the following expression (23).

$$S_{A1} = R_{12} \cdot m_3 + R_3 \qquad (23)$$

The outputs of the ROM table circuits 61 and 62 are supplied to a ROM table circuit 66 via latch circuits 64 and 65.

The ROM table circuit 66 receives the residue data $D_{20}$ and $D_{21}$ and outputs addition data $D_{A2}$ of the value $S_{A2}$ represented by the following expression (24).

$$S_{A2} = R_{20} \cdot m_1 \cdot m_2 \cdot m_3 + R_{21} \cdot m_2 \cdot m_3 \qquad (24)$$

The output of the ROM table circuit 63 is provided to an addition circuit 70 via latch circuit 67, adder 71 and latch circuit 69. The output of the ROM table circuit 66 is provided to the addition circuit 70 via latch circuit 69. The output of addition circuit 70 is represented by a binary code of value SA represented by the following relation (25).

$$SA = S_{A1} + S_{A2} = R_{20} \cdot m_1 \cdot m_2 \cdot m_3 + R_{21} \cdot m_2 \cdot m_3 + R_{21} \cdot m_3 + R_3 \qquad (25)$$

In other words, RNS data $D_{R0}$ consisting of the residue data $D_0$ and $D_3$ of the moduli $m_0$ to $m_3$, respectively, are converted into binary data $D_{B0}$.

Next, the principle of the decoder circuit according to the present invention as embodied will be explained. In the present invention, the modulus as a value of the power of 2, (i.e. $2^l$) is applied to the modulus of residue data which first are scaled down. Thus, if addition data of the value $S_B$ represented by the following relation (26) is output from the expression (25), the RNS data $D_{R0}$ can be demodulated into the binary data $D_{B0}$.

$$S_B = R_{20} \cdot m_1 \cdot m_2 \cdot 2^l + R_{21} \cdot m_2 \cdot 2^l + R_{12} \cdot 2^l + R_3 \qquad (26)$$

This means that the values $m_1 \cdot m_2 \cdot m_3$, $m_2 \cdot m_3$, and $M_3$ are not multiplicatively processed for the values $R_{20}$, $R_{21}$, and $R_{12}$ of the residue data $D_{20}$, $D_{21}$, $D_{12}$, respectively, in the first, second and third terms of the right side of the expression (26). The RNS data can be demodulated even if bit shifting is carried out by value 1 of the exponential part of the modulus $m_3$ represented by a power of 2 to add it to the residue data $R_3$ after the values $m_1 \cdot m_2$, $m_2$, and 1 are multiplicatively processed. This also means that the processing in demodulating the RNS data can be simplified.

More specifically, the ROM table circuit 66 outputs additional data $D_{R2}$ as represented by the relation (27) to an adder 70.

$$S_{B2} = R_{20} \cdot m_1 \cdot m_2 + R_{21} \cdot m_2 \qquad (27)$$

Furthermore, the ROM table circuit 63 is omitted and made to output residue data $D_3$ and $D_{12}$ directly to the adder 70 via a predetermined latch circuit (not shown).

In the adder 70, the addition data $D_{R2}$ and the residue data $D_{12}$ are bit-shifted by l bits toward the higher order bit side, and the residue data $D_3$ and $D_{12}$ are added with the addition data $D_{R2}$ respectively to be output.

Accordingly, addition data having the value $S_R$ represented by the following relation (28) can be obtained via the adder 70. It is found that substituting the expression (27) into the expression (28), binary data $D_{B0}$ demodulated based on the MRC method can be obtained.

$$S_B = S_{R2} \cdot 2^l + R_{12} \cdot 2^l + R_3 \qquad (28)$$

Thus, by having selected the modulus $m_3$ which firstly carries out scale-down processing to the value $2^l$ represented by a power of 2, the ROM table circuit 63 which outputs residue data represented by the third term of the right side of the expression (26) can be omitted.

Moreover, in the ROM table circuit 30, though the modulus $m_3$ has to be multiplicatively processed corresponding to the first and second terms of the right side of the expression (25), it is sufficient to output residue data which are multiplicatively processed with respect to the moduli $m_1 \cdot m_2$ and $m_2$ corresponding to the expression (26). Thus, the ROM table circuit 30 can be configured simpler.

Some decoder circuits of this kind perform a rounding process which after a predetermined addition bit is added with the value 1 in outputting binary data, bits below the addition bit concerned are cut off and output.

For the addition data to be obtained, an extra adder having the same bit length as the adder 22 has to be provided, and causing the configuration of the decoder circuit as a whole to become more complicated.

An adder 71 of, for example, 8 bits is provided between latches 67 and 69, so that the value 1 is added to the predetermined bit in the addition data $D_{B0}$ by adding the round processed data $D_3$ to the data before the addition data $D_{B0}$ are obtained (in this case, the addition data $D_{A1}$).

When, for example, 7, 11, 13 and 15 are selected as the moduli $m_0$, $m_1$, $m_2$ and $m_3$, the maximum value $S_{A1MAX}$ of the addition data $D_{A1}$ input to the adder 71 can be represented by the following relation (29) from the expression (22).

$$S_{A1MAX} \leq 12 \times 15 + 14 \leq 194 \qquad (29)$$

In other words, data having the maximum value 194 are obtained in the addition data $D_{A1}$, which can be represented by 8 bits. Even if the value 61 represented by the following expression (30) is added to the maximum value, it is found that carry exceeding the most significant bit does not yield.

$$(2^B - 1) - 194 = 61 \qquad (30)$$

Accordingly, the following relation (31) can be obtained with respect to the value 61.

$$2^B > 61 > 2^5 \qquad (31)$$

If the value 1 is added in the adder 71 in the range up to the fifth bit counted from the least significant bit (represented by $2^5$), it is found that the bit length does not vary in the addition data output from the adder 71.

Accordingly, if the value 1 is added in the range up to the fifth bit counted from the least significant bit in the adder 71, the same result of addition as that in the case where the value 1 is added in the range up to the fifth bit counted from the least significant bit can be obtained in the addition data $D_{B0}$ output from the adder 70. Thus, adder 70 may be used as it is without changing its configuration.

Since the least common multiple M of the moduli $m_{m0}$ to $m_3$ are represented by the following expression (32), the data having the maximum value of 15014 (that is, the value M−1) can be obtained.

$$M = m_0 \cdot m_1 \cdot m_2 \cdot m_3 = 15015 \qquad (32)$$

Accordingly, when the data having the value 15014 are represented by binary data, the relation represented by the following expression (33) is solved to obtain the value n=14, from which it is found that the binary data are represented by the data having the length of 14 bits.

$$2^n - 1 \geq 15014 \geq 2^{n-1} - 1 \qquad (33)$$

Accordingly, in the case where the addition data $D_{B0}$ are applied with rounding processing after the value 1 is added to the predetermined bit therein, an extra 14-bit adder is needed.

Thus, in the case where the addition data $D_{B0}$ are directly round-processed, a 14-bit adder is required for the rounding processing. For this, by adding the value 1 to the above predetermined bit in the range up to the fifth bit counted from the least significant bit using the adder concerned 71, the preparation of the 8-bit adder 71 allows addition data $D_{B0}$ added with the value 1 to the desired bit therein to be obtained and the whole configuration to be simplified.

Next, a concrete embodiment of a decoder circuit according to the present invention applied with this fundamental principle will be described using FIGS. 6A and 6B.

Figure 6A:
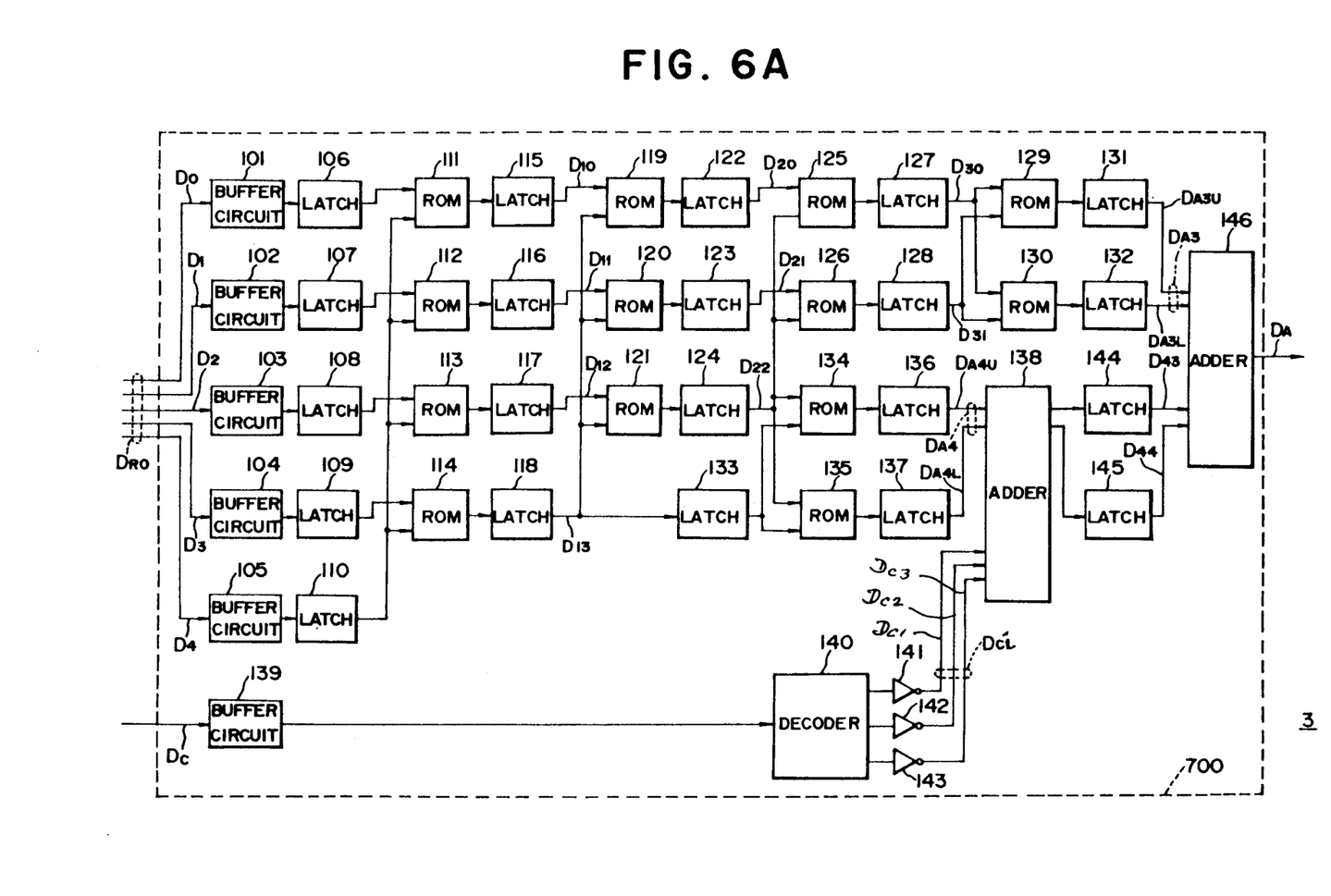
FIG. 6A and 6B are block diagrams showing an embodiment of the decoder according to the present invention.
Figure 6B:
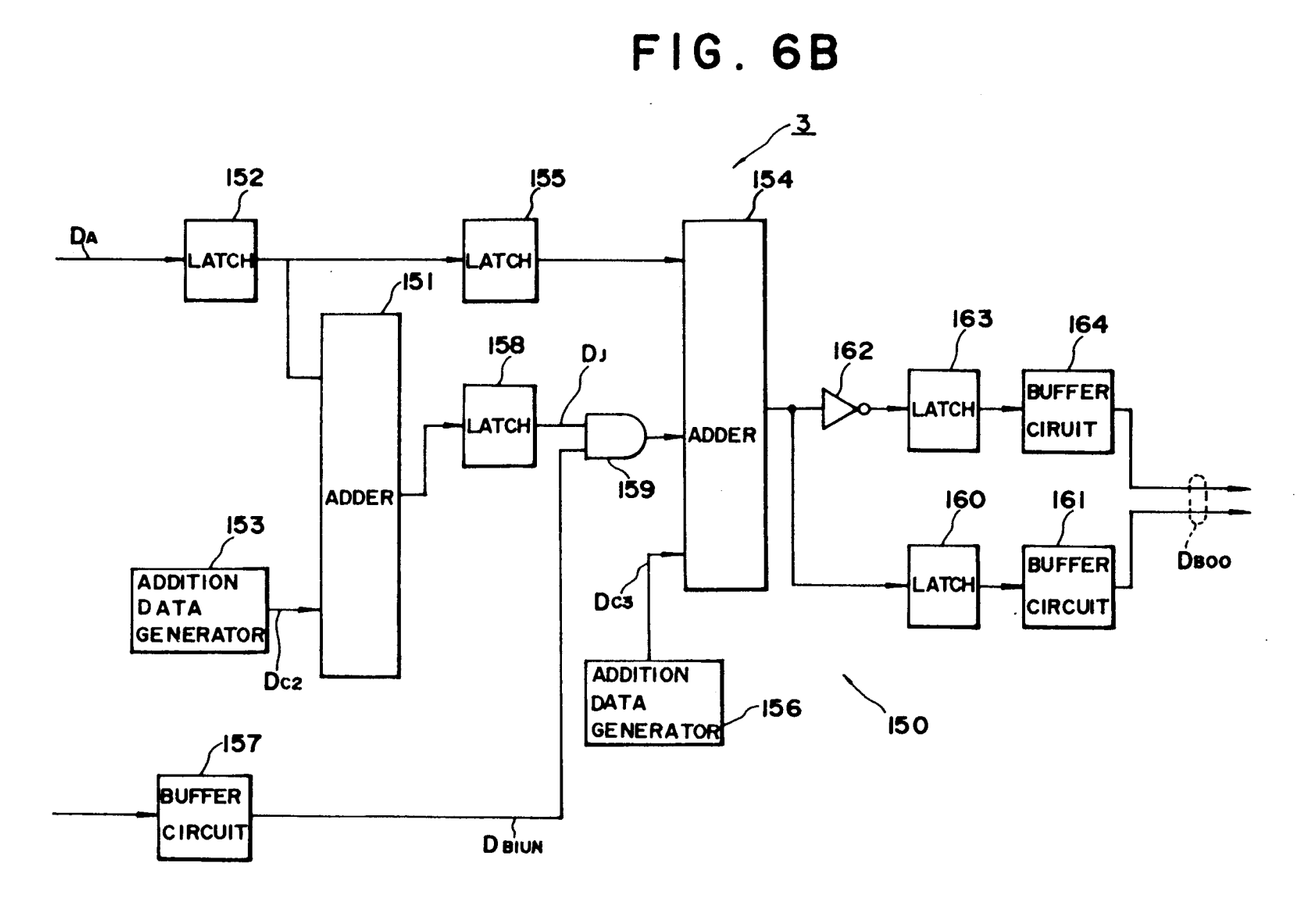

The decoder circuit 3 consists of the data conversion circuit part 100 shown in FIG. 6A and the latter half part 150 shown in FIG. 6B.

The RNS data $D_{R0}$ represented using the moduli $m_0$, $m_1$, $m_2$ and $m_3$ of the values 7, 11, 13 and 15 and the modulus $m_4$ of the value 16, a value of the power of 2, are employed here.

In other words, in the data conversion circuit part 100, the residue data $D_0$, $D_1$, $D_2$, $D_3$ and $D_4$ (that is, corresponding to the moduli $m_0$, $m_1$, $m_2$, $m_3$ and $m_4$) which compose the RNS data $D_{R0}$ are input to latches 106, 107, 108, 109 and 110 via buffer circuits 101, 102, 103, 104 and 105, respectively.

ROM table circuits 111, 112, 113 and 114 receive residue data $D_4$ of the modulus $m_4$ of the value 16 in addition to the residue data $D_0$, $D_1$, $D_2$ and $D_3$ and output residue data $D_{10}$, $D_{11}$, $D_{12}$ and $D_{13}$ of the moduli $m_0$, $m_1$, $m_2$, $m_3$, respectively.

In other words, with multiplicative inverse elements of value 16 (pertaining to the modulus $m_4$) set to values $X_{04}$, $X_{14}$, $X_{24}$ and $X_{34}$ for moduli $m_0$, $m_1$, $m_2$, $m_3$, (of values 7, 11, 13 and 15) respectively, residue data $D_{10}$, $D_{11}$, $D_{12}$ and $D_{13}$ having values $R_{10}$, $R_{11}$, $R_{12}$ and $R_{13}$ are represented by the following expressions (34), (35), (36) and (37), respectively, and output and scale-down processed with respect to the modulus $m_4$ of the value 16 represented by a power of 2.

$$R_{10} = \{(R_0 - R_4) \cdot X_{04}\} MOD\ m_0 \qquad (34)$$

$$R_{11} = \{(R_1 - R_4) \cdot X_{14}\} MOD\ m_1 \qquad (35)$$

$$R_{12} = \{(R_2 - R_4) \cdot X_{24}\} MOD\ m_2 \qquad (36)$$

$$R_{13} = \{(R_3 - R_4) \cdot X_{34}\} MOD\ m_3 \qquad (37)$$

ROM table circuits 119, 120 and 121 receive the residue data $D_{10}$, $D_{11}$, $D_{12}$ via latches 115, 116 and 117, respectively, and at the same time, receive the residue data $D_{13}$ via a latch circuit 118, then output residue data $D_{20}$, $D_{21}$, $D_{22}$ of moduli $m_0$, $m_1$ and $m_2$.

With multiplicative inverse elements of the value 15 (modulus $m_3$) pertaining to the moduli $m_0$, $m_1$, $m_2$ of values 7, 11 and 13 set to values $X_{03}$, $X_{13}$, $X_{23}$ respectively, residue data $D_{20}$, $D_{21}$, $D_{22}$ having values $R_{20}$, $R_{21}$, $R_{22}$ represented by the following expressions (38), (39) and (40) respectively are output and scale-down processed with respect to the modulus $m_3$.

$$R_{20} = \{(R_{10} - R_{13}) \cdot X_{03}\} MOD\ m_0 \qquad (38)$$

$$R_{21} = \{(R_{11} - R_{13}) \cdot X_{13}\} MOD\ m_1 \qquad (39)$$

$$R_{22} = \{(R_{12} - R_{13}) \cdot X_{23}\} MOD\ m_2 \qquad (40)$$

Furthermore, ROM table circuits 125 and 126 receive residue data $D_{20}$ and $D_{21}$ via latches 122 and 123, respectively, and at the same time, receive residue data $D_{22}$ via a latch 124. The ROM table circuits 125 and 126 output residue data $D_{30}$ and $D_{31}$ of the moduli $m_0$ and $m_1$.

With multiplicative inverse elements of the value 13 (modulus $m_2$) pertaining to the moduli $m_0$ and $m_1$ of the values 7 and 11 set to values $X_{02}$ and $X_{12}$, residue data $D_{30}$ and $D_{31}$ having values $R_{30}$ and $R_{31}$ represented by the following expressions (41) and (42) are output and scale-down processed with respect to the modulus $m_2$.

$$R_{30} = \{(R_{20} - R_{22}) \cdot X_{02}\} MOD\ m_0 \qquad (41)$$

$$R_{31} = \{(R_{21} - R_{22}) \cdot X_{12}\} MOD\ m_1 \qquad (42)$$

ROM table circuits 129 and 130 receive the residue data $D_{30}$ and $D_{31}$ concerned Via latches 127 and 128, and output to latches 131 and 132 respectively the addition data $D_{A3u}$ and $D_{A3L}$ which are the six higher order bits and eight lower order bits respectively of the addition data $D_{A3}$ having value $S_{A3}$ represented by the following expression (43).

$$S_{A3} = R_{30} \cdot m_1 \cdot m_2 \cdot m_3 + R_{31} \cdot m_2 \cdot m_3 = R_{30} \cdot 11 \cdot 13 \cdot 15 + R_{31} \cdot 13 \cdot 15 \qquad (43)$$

For this, ROM table circuits 134 and 135 receive residue data $D_{22}$ and $D_{13}$ via latches 124 and 133, and output addition data $D_{A4u}$ and $D_{A4L}$ which are the four higher order bits and four lower order bits, respectively, of addition data $D_{A4}$ having values $S_{A4}$ represented by the following expression (44) to an adder 138 via latches 136 and 137.

$$S_{A4} = R_{22} \cdot m_3 + R_{13} = R_{22} \cdot 15 + R_{13} \qquad (44)$$

A buffer circuit 139 is supplied with a control signal $D_c$ of two bits for round processing. A decoder 140 decodes signal $D_c$ into 3 bits and supplies the three bits $c_1$, $D_{c2}$, $D_{c3}$ to the adder 138 via inverted amplifier circuits 141, 142 and 143, respectively.

The adder 138 receives the addition data $D_{ci}$, which is added with addition data $D_{A4u}$ and $D_{A4L}$ output from the ROM table circuits 134 and 135, both being bit-shifted by three bits from their least significant bit. The output of the adder 138 is output to latch circuits 144 and 145.

Finally, in an adder 146, when the value of the addition data $D_{ci}$ output from the decoder circuit 140 is 0, the result of addition of the Value $S_A$ represented by the following relation (45) can be obtained from the expressions (43) and (44).

$$S_A = R_{30} \cdot m_1 \cdot m_2 \cdot m_3 + R_{31} \cdot m_2 \cdot m_3 + R_{22} \cdot m_3 + R_{13} = R_{30} \cdot 11 \cdot 13 \cdot 15 + R_{31} \cdot 13 \cdot 15 + R_{22} \cdot 15 + R_{13} \quad (45)$$

When the above result is processed so as to be represented by the following relation (46), the RNS data $D_{R0}$ can be demodulated into binary data having the value $S_A$.

$$\begin{aligned} S_A &= S_A m_4 + R_4 \\ &= (R_{30} \cdot 11 \cdot 13 \cdot 15 + R_{31} \cdot 13 \cdot 15 + R_{22} \cdot 15 + R_{13}) \cdot 16 + R_4 \\ &= R_{30} \cdot 11 \cdot 13 \cdot 15 \cdot 16 + R_{31} \cdot 13 \cdot 15 \cdot 16 + R_{22} \cdot 15 \cdot 16 + R_{13} \cdot 16 + R_4 \end{aligned} \quad (46)$$

Accordingly, in this case, if the result of addition $S_A$ is added with residue data $D_4$ having the value $R_4$ after it is bit-shifted by four bits correspondingly to the value 4 of the exponential part of the module represented by a power of 2, addition data represented by the MRC method can be obtained.

Because the least common multiple of the moduli $m_0$ to $m_4$ is represented by the following expression (47), the following relation (48) may be solved to obtain a value for n. In this case, $n = 18$ and thus, the RNS data $D_{R0}$ can be represented by binary data of 18 bits as a whole.

$$M = \prod_{j=0}^{4} m_j = 7 \cdot 11 \cdot 13 \cdot 15 \cdot 16 = 240240 \quad (47)$$

$$2^{n-1} - 1 = 240239 = 2^n - 1 \quad (48)$$

The 14 bit addition data $D_4$ are output by omitting four bits of the addition data in advance.

In other words, when the addition data represented by the expression (46) are subjected to scaling processing to omit four bits, dividing by the value 16 can be executed by only adding addition data $D_{A3u}$, $D_{A3L}$, $D_{A4u}$, $D_{A4L}$, as they are, which are output from ROM table circuits 129, 139, 134 and 135 and represented by the expression (45).

Thus, the modulus $x_4$ is set to the value 16, and at the same time, scale-down processing first is applied to the modulus $m_4$ thereby allowing the configuration of an adder in scaling processing to be simplified, and the configuration of the decoder 3 as a whole to be simplified.

On the other hand, the decoder circuit 140 is designed in such a manner that the values of the addition data $D_{ci}$ are sequentially changed-over between the values r1, 0, $0_j$, r0, 1, $0_j$, and r0, 0, $1_j$, in order from the most significant bit. The value 1 is added to the fifth bit, fourth bit, and third bit counted from the least significant bit as a whole by shifting the addition data $D_{ci}$ concerned by three bits adding them to the addition data $D_A$.

Furthermore, the decoder circuit 140 is designed so that the value of the addition data $D_{ci}$ can be changed over to the value r0, 0, $0_j$ and so that selection can be made to subject or not subject the addition data $D_A$ to round processing.

In the embodiment described, because the addition data $D_A$ of 14 bits are output as they are without omitting bits below the bit added with the value 1, bits up to the necessary bit from the most significant bit can be selectively employed in accordance with the bit added with the value 1.

In the case where negative numbers are dealt with in the decoder circuit 3, the discrimination between positive numbers and negative numbers is performed by determining whether the value of demodulated natural binary addition data is larger than the fixed value (in this case, the value $(M-1)/2+1$) or not. In practice, a comparator circuit having large bit numbers is needed, causing the configuration of the decoder circuit and the signal processing circuit as a whole to become more complicated.

In the decoder circuit 3 according to the present invention, the addition data $D_A$ output from the data conversion circuit part 100 are added with the fixed value, and positive numbers are discriminated from negative numbers by the most significant bit of the added value obtained.

In other words, as shown in FIG. 6B as circuit part 150 in the following stage receiving the addition data $D_A$ from the data conversion circuit part 100, an adder 151 receives the twelve higher order bits of the addition data $D_A$ via a latch circuit 152, and at the same time, receives addition data $D_{c2}$ having, for the example described, the value 171 output from an addition data generating circuit 153. The most significant bit of the adder sum is output as a discriminating signal $D_j$.

Figure 7:
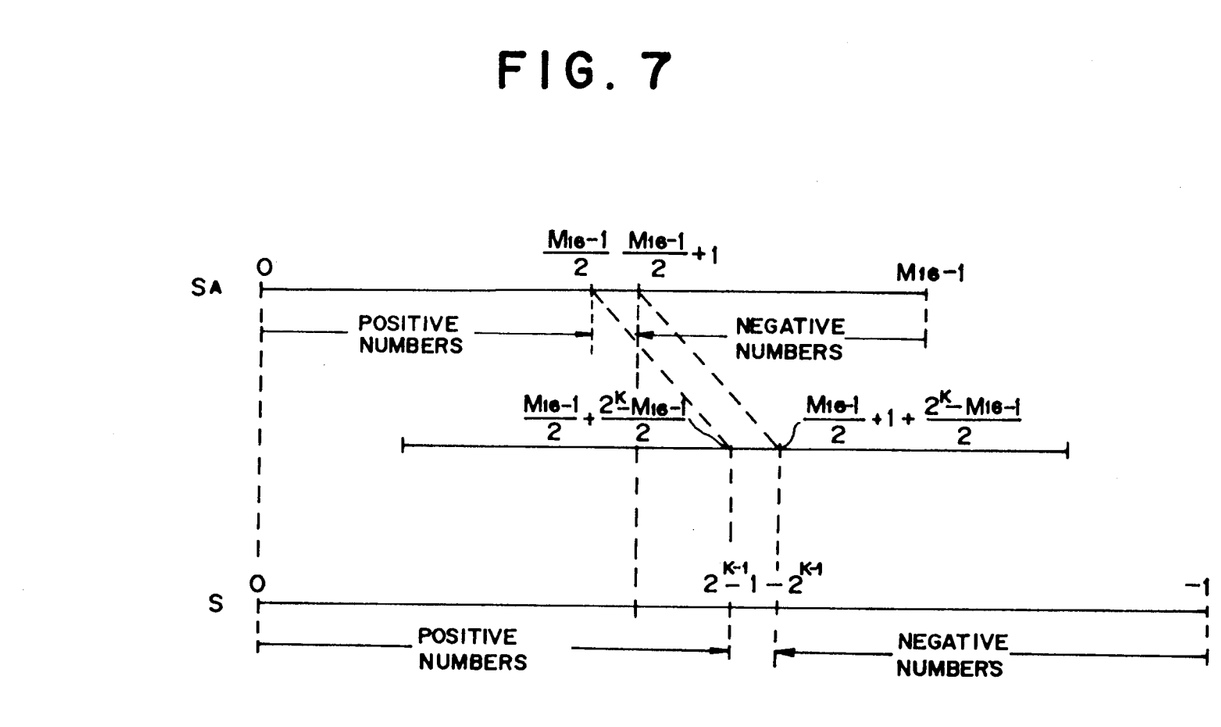
FIG. 7 is a schematic diagram for illustrating the operation of the decoder according to the present invention.

Referring to FIG. 7, because the addition data $D_A$ obtained by demodulating RNS data are addition data of which the fourteen higher order bits are subjected to scaling processing, the addition data represent negative numbers when the addition value $S_A$ is between $(M_{16}-1)/2+1$ and $(M_{16}-1)$. In this case, the value $M_{16}$ is 15015 of 1/16 times the minimum common multiple $M = 240240$ of the moduli $m_0$ through $m_4$ since the addition data $D_A$ are subjected to scaling processing by four bits. On the other hand, in the k-bit binary data, negative numbers are represented when the value S, having a most significant bit of value 1, is between $2^k$ and $2^{k-1}$.

If the addition data $D_A$ are added with the fixed value in such manner that the minimum value representing negative numbers of the addition data $D_A$, (i.e. $(M_{16}-1)/2+1$) becomes the minimum value of the binary data for representing negative numbers (i.e. $2^{k-1}-1$), and such that the addition data $D_A$ are converted into the fixed data (hereinafter called conversion data), of value $S_{TR}$, the value of the most significant bit is negative.

If the operation is done in this way, it is possible to discriminate positive numbers from negative numbers using a simple configuration by which the addition data $D_A$ are added with the fixed value without comparing all of 14 bits to output the most significant bit, thus allowing the decoder circuit 3 to achieve a simple configuration.

In the case where the discrimination is carried out using twelve higher order bits, it is sufficient to add the value 171, that is, the value obtained by dividing 685 by 2 by cutting two bits, while it is essentially necessary to add 684 up to 14 bits. This reduces the size of hardware.

An adder 154 receives addition data $D_A$ via a latch circuit 155, addition data $D_{c3}$ output from an addition data generating circuit 156, and a bipolar switching signal $D_{BIUN}$ output from an AND circuit 159. The AND circuit 159 receives the output of a buffer circuit 157 together with a discriminating signal $D_j$ obtained from the adder 151 via a latch circuit 158. The adder 154 adds to the addition data $D_A$ the value 1369 (that is, $2^k - M16$) which is output from the addition data generating circuit 156 when the logic level of the discriminating signal $D_j$ rises to logic $r1_j$.

When the addition data $D_A$ represent negative numbers, binary data added with the value 1369 are obtained for the addition data $D_A$. On the contrary, when the addition data $D_A$ represent positive numbers, the addition data $D_A$ are output as they are.

Thus, the addition data $D_A$ are converted into binary data of 2's complement to be output.

The adder 154 outputs the addition data $D_A$ irrespective of the logic level of the discriminating signal $D_j$ as they are when the bipolar switching signal $D_{BIUN}$ is changed over.

As a result, the adder 154 allows bipolar binary data to be switched and output as required by switching the bipolar switching signal $D_{BIUN}$.

The adder 154 outputs thirteen higher order bits among the binary data concerned having 14 bits via a latch circuit 160 and a buffer circuit 161. At the same time, the adder 154 outputs the most significant bit of the binary data concerned via an inverting amplifier 162, a latch circuit 163, and a buffer circuit 164, thereby outputting binary data $D_{B0}$ comprising bipolar binary data and offset binary data.

When a fixed bit of data having a short bit length before the addition data $D_A$ are obtained is added with the value 1, the addition data $D_A$ having a large value as a whole are obtained in accordance with the addition bit concerned. A problem to avoid is mistaking the addition data $D_A$ of a large positive number for a negative number.

In the case where the value 1 is added to, for example, the $(y+1)$ bit counted from the most significant bit to apply rounding processing down to L bits, the addition data $D_A$ is represented by the value $2^{k-y-1}$ plus the addition data because the $(y+1)$th bit is added with the value 1. Thus, the maximum value and the minimum value change from the value $(M-1)/2$ and $(M-1)/2+1$ to $(M-1)/2+2^{k-y-1}$ and $(M-1)/2+1+2^{k-y-1}$), respectively.

Accordingly, when the addition data have a larger value than the value $(M-1)/2+1+2^{k-y-1}$, the value of the addition data $D_{c2}$ from the addition data generating circuit 153 is set so as to allow the region representing negative numbers to be discriminated. At the same time, if the value of the addition data from the addition data generating circuit 156 is set to the value $(2^k M - 2^{k-y-1})$ in such a manner that the maximum value $(M-1+2^{k-y-1})$ of the addition data $D_A$ becomes the value $(2^{k-1}-2^{k-y-1})$, which is smaller than the maximum value $(2^k31\ 1)$ of the binary data $D_{B0}$ by the value $2^{k-y-1}$ (that is, the addition data $D_A$ is assigned to the region having a smaller value of a negative number than the regular value by the value increased as a whole), bipolar binary data can be obtained by adding the value 1 to $(y+1)$th bit counted from the most significant bit.

Variations of the encoder and decoder are described below.

When positive and negative numbers are assigned to regions represented by RNS data in the above-mentioned embodiment, the case where the fixed value (that is, the value $(M-2^n)$ is added to data of higher order bits is described. The method by which positive and negative numbers are assigned, however, is not restricted to the above method. For example, after the fixed value $(M-2^n)$ is added to data of lower order bits, residue data may be obtained from the result of addition. The value $(M-2^n)$ then is added to the added value of the residue data obtained from data of higher order bits and data of lower order bits. This method is widely applicable to these cases and the like.

Further, in the above-mentioned embodiment, there has been described the case where unipolar binary data obtained by the MRC method are converted into bipolar binary data. The means by which RNS data are converted, however, is not so restricted. For example, the Chinese residue theorem and the like can be used.

Further, in the above-mentioned embodiment, there has been described the case where RNS data are subjected to scaling processing in converting rounding into binary data and at the same time, to rounding processing. The present invention is not so restricted. RNS data may be subjected to processing of scaling or rounding as required.

Further, in the above-mentioned embodiment, there has been described the case where addition data are converted into bipolar binary data to be output. The present invention is not so restricted. RNS data may be, for example, directly output as required.

Further, in the above-mentioned embodiment, there had been described the case where the fixed bit of the addition data $D_{A4}$ output from the ROM table circuits 134 and 135 is added with the value 1. The present invention is not so restricted. For example, the fixed bit of the residue data $D_{13}$ may be added with the value 1.

Further, in the above-mentioned embodiment, there has been described the case where the fixed bit is added with the value 1 in such a manner that bits do not overflow in the adder 138. The present invention is not so restricted. Bits are made to overflow as required, and addition data having a long bit length may be output to the adder 146. Even if the addition data are output so that bits do not overflow in the adder 138, an addition may be applied to addition data having the bit length of eight bits compared with the case where addition is applied to addition data having the bit length of 14 bits, thereby allowing the whole configuration to be simplified.

Further, in the above-mentioned embodiment, there had been described the case where binary data of 13 bits are output by obtaining addition data of 14 bits of which a fixed bit is added with the value 1. The bit length which is output, however, is not restricted to 13 bits, but may be switched in accordance with the bit added with the value 1.

Further, in the above-mentioned embodiment, there has been described the case where negative numbers are detected by adding the value 171 to the data of the higher order 12 bits of the unipolar binary data of 14 bits. The present invention is not so restricted. Negative numbers may be detected by adding the value 684 to binary data of 14 bits. In addition the bit length may be selected within a sufficient range for practical application, and at the same time, the added value may be set in accordance with the above bit length.

Further, in the above-mentioned embodiment, there has been described the case where unipolar binary data in the region of value 15015 is represented by an odd number of 1/16 times the minimum common multiple of the moduli $m_0$ to $m_4$ to which positive and negative numbers are assigned and converted into bipolar binary data by scaling processing. In the case where the region concerned is represented by an even number, however, the value $(2^k-M)/2$ is added in place of the value $(2^k-M-1)/2$, and the most significant bit of the result of addition may be used as a discriminating signal $D_j$.

Further, in the above-mentioned embodiment, there has been described the case where RNS data are obtained with respect to five moduli of the values 7, 11, 13, 15 and 16. The number and the value of the moduli are not restricted to such values and can be selected as required.

Further, in the above-mentioned embodiment, there has been described the case where digital video signals composed of binary data of 14 bits are converted into RNS data. The bit length of binary data is not restricted to this, but is applicable to a wide range.

Further, in the above-mentioned embodiment, there has been described the case where the present invention is applied to encoder circuits and decoder circuits in digital filter circuits. The present invention is not restricted to this, but is widely applicable to digital signal processing circuits for audio signals, video signals, and the like.

What is claimed is:

1. An encoder circuit for converting input data composed of binary codes into RNS data, comprising:

dividing means using fixed bits of a predetermined length for dividing said input data having the value S into upper bit data $S_u$ and lower bit data having the value $S_L$ in the relation $$S=S_u \times 2^q + S_L$$

in which $2^q$ is a weighted value;

a first ROM table circuit for weighing each of said upper and lower bit data and converting said upper and lower bit data into residue data for respective fixed RNS moduli, said residue data having a value $R_i$ represented by the equation $R_i=(R_{ui}+R_{Li})$ MOD $m_i$, wherein $R_{ui}$ is an upper bit residue data value $R_{Li}$ is a lower bit residue data value of a modulus $m_i$;

a second ROM table circuit for converting an addition value of said residue data for each of said moduli into residue data of respective moduli and said addition value has a residue data value $D_i$ composed of the added values of lower bit residue data $D_L$ and upper bit residue data $D_u$; and means for outputting said residue data obtained from said second ROM table circuit as said residue data composing said RNS data.

2. A decoding method for demodulating RNS data composed of residue data of a plurality of moduli into binary data by a Mixed Radix Conversion Method (MRC) using a multiplicative inverse element of a value of one modulus for that of another modulus to reduce the number of residue data, comprising the steps of:

selecting one of said moduli to be a value represented by the power of 2 and said moduli has residue data value $R_i$ or residue data value $R_j$ of moduli $m_i$ or $m_j$, respectively, applying to residue data scale-down processing performed in parallel pertaining to said one of said moduli represented by said power of 2 and said residue scale-down processing having a value $R_{ji}$ represented by the expression $R_{ji}=\{(R_i-R_j)X_{ij}\}$ MOD $m_i$, wherein $X_{ij}$ is a multiplicative inverse element of the modulus $m_j$, and applying to said residue data scale-down processing pertaining to each of the remaining of said plurality of moduli.

3. A decoder method for demodulating RNS data into binary data, comprising the steps of:

scale-down processing the RNS data of a plurality of fixed moduli for obtaining a plurality of residue data corresponding to each of said moduli of the RNS data, said scale-down processing using multiplicative inverse values of the RNS set to the values of said moduli, addition processing said residue data with said fixed moduli, respectively, to obtain addition data, thereby demodulating the RNS data into binary data, said addition processing adding data $D_i$ which are bit-shifted by l bits, and adding the value 1 to a fixed bit of said RNS data to achieve fixed data intermediate said scale-down processing and said addition processing for discriminating positive and negative numbers.

4. A decoder circuit for converting RNS data into unipolar binary data comprising:

a data converting circuit for converting said RNS data into unipolar binary data;

a discriminating circuit for adding a first fixed value to said binary data output from said data converting circuit and outputting the most significant bit of the result of said adding for discriminating between positive and negative numbers by the most significant bit, and an adder for adding a second fixed value to said unipolar binary data and outputting the result thereof as said bipolar binary data.

5. A decoder circuit comprising:

a first data converting circuit for converting RNS data into binary data;

an adder for adding the value 1 to a fixed bit of said binary data for discriminating between positive and negative numbers by the most significant bit, and a second data converting circuit for adding a fixed value to said binary data including said fixed bit added with the value 1, thereby converting said binary data into bipolar binary data.

* * * * *